US008963150B2

(12) United States Patent
Yeo et al.

(10) Patent No.: US 8,963,150 B2
(45) Date of Patent: Feb. 24, 2015

(54) SEMICONDUCTOR DEVICE HAVING A TEST PAD CONNECTED TO AN EXPOSED PAD

(75) Inventors: Dong-Hyun Yeo, Seoul (KR); Yong-Bum Kim, Suwon-si (KR); Byung-Kil Jeon, Asan-si (KR); Bong-Ju Jun, Cheonan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 250 days.

(21) Appl. No.: 13/323,079

(22) Filed: Dec. 12, 2011

(65) Prior Publication Data

US 2013/0032800 A1  Feb. 7, 2013

(30) Foreign Application Priority Data

Aug. 2, 2011 (KR) .......................... 10-2011-0077020

(51) Int. Cl.
*H01L 23/58* (2006.01)
*H01L 29/10* (2006.01)
*G01R 31/04* (2006.01)

(52) U.S. Cl.
CPC ..... *G01R 31/046* (2013.01); *H01L 2224/48091* (2013.01); *H01L 2224/48247* (2013.01)
USPC ...... 257/48; 257/690; 257/784; 257/E21.524; 257/E23.141

(58) Field of Classification Search
USPC ............ 257/48, 690, 784, E21.524, E23.141
See application file for complete search history.

(56) References Cited

U.S. PATENT DOCUMENTS

| 6,351,405 | B1 * | 2/2002 | Lee et al. .......................... 365/63 |
| 6,538,313 | B1 * | 3/2003 | Smith ............................ 257/684 |
| 6,853,202 | B1 | 2/2005 | Chang et al. |
| 7,042,068 | B2 * | 5/2006 | Ahn et al. ...................... 257/666 |
| 7,713,764 | B2 | 5/2010 | Mizoguchi |
| 2006/0194353 | A1 | 8/2006 | Spuhler et al. |
| 2009/0174051 | A1 | 7/2009 | Osaka et al. |

FOREIGN PATENT DOCUMENTS

| JP | 02-205778 | 8/1990 |
| JP | 06-222109 | 8/1994 |
| JP | 06-232295 | 8/1994 |
| JP | 06-268105 | 9/1994 |
| JP | 09-223725 | 8/1997 |

(Continued)

OTHER PUBLICATIONS

Extended European Search Report dated Nov. 10, 2014 for European Patent Appl. No. 12157652.4.

*Primary Examiner* — Robert Huber
(74) *Attorney, Agent, or Firm* — F. Chau & Associates, LLC

(57) ABSTRACT

A semiconductor device includes a circuit board including a ground portion, and a semiconductor package disposed on the circuit board. The semiconductor package includes an external connecting pad and an exposed pad. The exposed pad and the ground portion are electrically connected at a first surface of the exposed pad. A semiconductor chip is disposed on a second surface of the exposed pad and electrically connected to the external connecting pad. The first surface of the exposed pad is located external to the semiconductor package, and the second surface of the exposed pad is located within the semiconductor package. A test pad is disposed on the semiconductor chip and is electrically connected to the exposed pad.

15 Claims, 3 Drawing Sheets

(56) References Cited

FOREIGN PATENT DOCUMENTS

| | | |
|---|---|---|
| JP | 09-330962 | 12/1997 |
| JP | 11-264853 | 9/1999 |
| JP | 2001-007275 | 1/2001 |
| JP | 2005-057173 | 3/2005 |
| JP | 2005-209882 | 8/2005 |
| JP | 2010-021362 | 1/2010 |
| KR | 1020060130125 | 12/2006 |
| WO | 2010126511 | 11/2010 |

* cited by examiner

SEMICONDUCTOR DEVICE HAVING A TEST PAD CONNECTED TO AN EXPOSED PAD

CROSS-REFERENCE TO RELATED APPLICATION

This application claims priority under 35 U.S.C. §119 to Korean Patent Application No. 10-2011-0077020, filed on Aug. 2, 2011, the disclosure of which is incorporated by reference herein in its entirety.

BACKGROUND

1. Technical Field

Exemplary embodiments of the present invention relate to a semiconductor device. More particularly, exemplary embodiments of the present invention relate to a semiconductor package disposed on a circuit board.

2. Discussion of the Related Art

A semiconductor package protects a semiconductor chip from an external environment, and controls the humidity and temperature of the area surrounding the semiconductor chip. Advancements in semiconductor packaging technology have resulted in semiconductor packages that are light, thin, small, and have a high density. A semiconductor package may be classified as an inserting-type package or a surface-mounting-type package.

For example, a quad flat pack (QFP) semiconductor package is a type of surface-mounting package that is often used for a timing controller in a liquid crystal display. The package used for the timing controller may include an exposed pad at the rear surface of the package. The exposed pad may be bonded to a ground surface on a circuit board, so as to stably maintain a ground level of the semiconductor chip and discharge heat to the rear surface.

However, if the exposed pad is not firmly bonded to the ground surface of the circuit board, normal operation of the semiconductor device may not occur due to the insufficient grounding of the timing controller.

SUMMARY

Exemplary embodiments of the present invention include a semiconductor device that allows for a determination to be made regarding whether an exposed pad of a semiconductor package is firmly bonded with a ground surface of a circuit board.

An exemplary embodiment of the present invention includes a semiconductor device including a circuit board including a ground portion, a semiconductor package disposed on the circuit board and including an external connecting pad and an exposed pad, a semiconductor chip disposed on the exposed pad and electrically connected to the external connecting pad, and a test pad disposed on the semiconductor chip and electrically connected to the exposed pad. The exposed pad and the ground portion of the circuit board are electrically connected at a first surface of the exposed pad. The semiconductor chip is disposed on a second surface of the exposed pad. The first surface of the exposed pad is located external to the semiconductor package and the second surface of the exposed pad is located within the semiconductor package.

The semiconductor device may include a resistor part disposed in the semiconductor chip, and electrically connected to the test pad.

The resistor part may be a pull-up resistor.

The semiconductor device may be configured to output a logic high signal when the semiconductor device is operating in a fail mode, and output a logic low signal when the semiconductor device is operating in a normal mode.

The semiconductor device may operate in the fail mode when the exposed pad and the ground portion are not electrically connected, and operate in the normal mode when the exposed pad and the ground portion are electrically connected.

The first portion of the resistor part may be connected to a voltage source, and a second portion of the resistor part may be connected to the test pad.

The semiconductor device may include a wire electrically connecting the test pad and the exposed pad.

The semiconductor device may include a test pin electrically connected to the test pad, and a test point disposed in the semiconductor package and electrically connected to the test pin.

The test point may be an end of the test pin.

The test point may be an electrical pad, and the test pin may be electrically connected to the electrical pad.

The semiconductor device may include a measuring device electrically connected to the test point, and configured to determine whether the exposed pad and the ground portion are electrically connected.

The external connecting pad may be disposed substantially near a first corner of the semiconductor package, and the test point may be disposed substantially near a second, opposing corner of the semiconductor package.

The test pad may be disposed near an edge of an upper surface of the semiconductor chip.

The exposed pad and the ground portion of the circuit board may be bonded to each other using solder.

The semiconductor device may include a wire electrically connecting the semiconductor chip and the external connecting pad.

An exemplary embodiment of the present invention includes a semiconductor package including an external connecting pad, an exposed pad having a first surface and a second surface, a semiconductor chip, and a test pad. The first surface of the exposed pad is located external to the semiconductor package and is electrically connected to a ground portion of a circuit board. The second surface is located within the semiconductor package. The semiconductor chip is disposed on the second surface of the exposed pad, and is electrically connected to the external connecting pad. The test pad is disposed on the semiconductor chip, and is electrically connected to the exposed pad.

The semiconductor package may include a resistor part disposed in the semiconductor chip, and electrically connected to the test pad.

The resistor part may be a pull-up resistor.

The semiconductor package may be configured to output a logic high signal when the semiconductor package is operating in a fail mode, and output a logic low signal when the semiconductor package is operating in a normal mode.

The semiconductor package may include a test pin electrically connected to the test pad, and a test point disposed in the semiconductor package and electrically connected to the test pin.

According to exemplary embodiments of the present invention, a contact defect(s) present between the ground surface of the circuit board and the exposed pad of the semiconductor package may be detected without using an additional pin.

DETAILED DESCRIPTION

Figure 1:
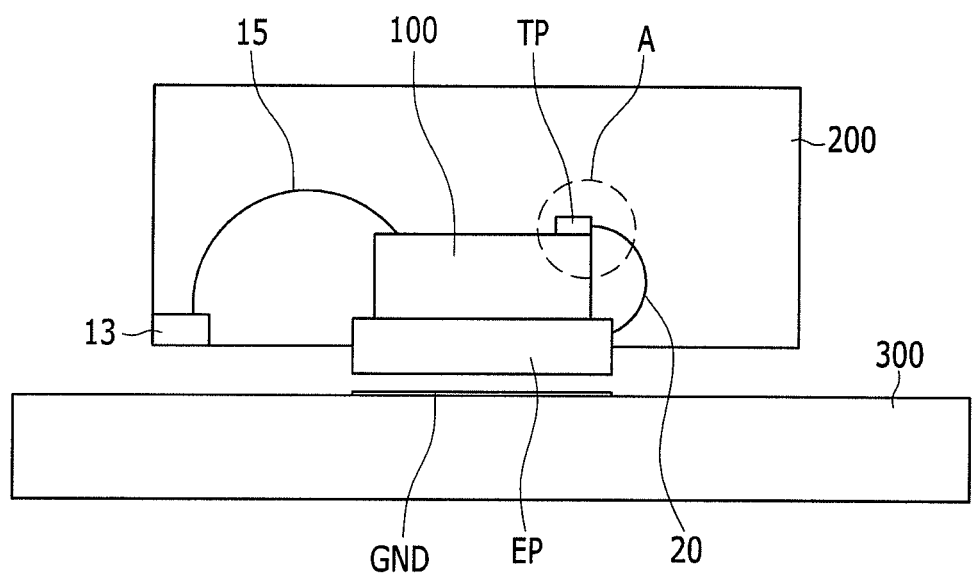
FIG. 1 is a cross-sectional view illustrating a semiconductor device according to an exemplary embodiment of the present invention.

Exemplary embodiments of the present invention will be described more fully hereinafter with reference to the accompanying drawings. As will be understood by those having ordinary skill in the art, the exemplary embodiments may be modified in various ways without departing from the spirit or scope of the present invention. In the drawings, the thickness of layers, films, panels, regions, etc., may be exaggerated for clarity. It will be understood that when a layer is referred to as being "on" another layer or substrate, it may be directly on the other layer or substrate, or an intervening layer or layers may be present. Like reference numerals may refer to like elements throughout the accompanying drawings.

Figure 2:
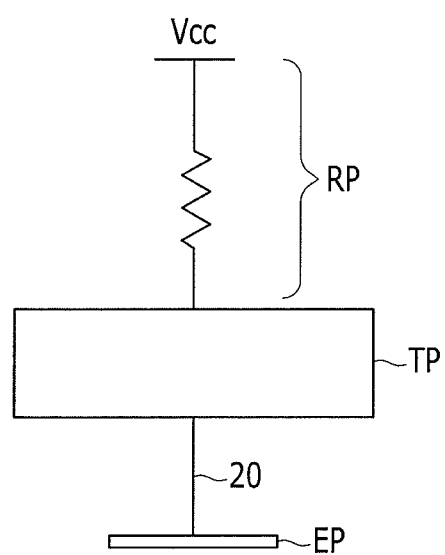
FIG. 2 is an enlarged schematic view illustrating portion "A" of FIG. 1.

FIG. 1 is a cross-sectional view illustrating a semiconductor device according to an exemplary embodiment of the present invention. FIG. 2 is an enlarged schematic view illustrating portion "A" of FIG. 1.

Referring to FIG. 1, a semiconductor package 200 is disposed on a circuit board 300.

An exposed pad (e.g., e-pad EP) is disposed at the rear surface of the semiconductor package 200. In FIG. 1, the e-pad EP is located near the center of the rear surface of the semiconductor package 200, however, the location of the e-pad EP is not limited thereto. A semiconductor chip 100 is disposed on the e-pad EP. The semiconductor chip 100 is connected to an external connecting pad 13. For example, wire bonding using wiring 15 may be utilized to electrically connect the semiconductor chip 100 to the external connecting pad 13. In FIG. 1, the external connecting pad 13 is disposed near a corner of the semiconductor package, however, the location of the external connecting pad 13 is not limited thereto.

According to the exemplary embodiment shown in FIG. 1, a test pad TP is disposed on the semiconductor chip 100. The test pad TP may be disposed at a variety of locations on the semiconductor chip 100. For example, in FIG. 1, the test pad TP is disposed near an edge of the upper surface of the semiconductor chip 100, and the test pad TP is electrically connected to the e-pad EP. Wire bonding using wiring 20 may be used to electrically connect the test pad TP and the e-pad EP, as shown in FIG. 1, however the manner in which the test pad TP and the e-pad EP are electrically connected is not limited thereto.

The circuit board 300 includes a ground surface GND disposed at a portion corresponding to the e-pad EP of the semiconductor package 200. For example, in FIG. 1, the ground surface GND is disposed near the center of the circuit board 300 such that the ground surface GND aligns with the e-pad EP of the semiconductor package 200. The ground surface GND and the e-pad EP may be disposed at a variety of locations on the circuit board 300 and the semiconductor package 200, respectively. In FIG. 1, a space is shown between the ground surface GND of the circuit board 300 and the e-pad EP. As will be appreciated by one having ordinary skill in the art, this space is included for illustrative purposes to show the formation and alignment of the ground surface GND and the e-pad EP. In the exemplary embodiment, the ground surface GND of the circuit board 300 and the e-pad EP make contact with each other. The e-pad EP includes a first surface and a second, opposing surface. As shown in FIG. 1, the first surface of the e-pad EP is located external to the semiconductor package 200, and makes contact with the ground surface GND of the circuit board 300. The second surface of the e-pad EP is located within the semiconductor package 200, and may be connected to the semiconductor chip 100.

FIG. 2 is an enlarged schematic view illustrating portion "A" of FIG. 1.

Referring to FIG. 2, the test pad TP is connected to a resistor part RP. The resistor part RP may be an element disposed in the semiconductor chip 100 having a resistance. For example, the resistor part RP may be a pull-up resistor.

As discussed above, the e-pad EP and the ground surface GND are in contact with each other. For example, the e-pad EP and the ground surface GND may be bonded to each other using a soldering process to maintain contact. Contact defects may be generated during the soldering process, resulting in a break in the connection between the e-pad EP and the ground surface GND. The resistor part RP (e.g., the pull-up resistor) may be used to determine whether a contact defect has been generated and whether a break in the connection between the e-pad EP and the ground surface GND has occurred.

For example, when there is a break in the connection between the e-pad EP and the ground surface GND (e.g., a break in the connection may occur when contact defects are generated during the soldering process), the resistor part RP pulls the voltage at the test pad TP towards voltage source Vcc. As a result, the output of the semiconductor device is brought to a high logic level. When the output is a high logic level, the semiconductor device is operating in a fail mode. When the e-pad EP and the ground surface GND are properly connected with each other (e.g., no contact defects were generated during the soldering process), the output of the semiconductor device is brought to a low logic level. When the output is a low logic level, the semiconductor device is operating in a normal mode. Accordingly, exemplary embodiments of the present invention allow for the verification of whether the e-pad EP and the ground surface GND are stably electrically connected with each other (e.g., no contact defects were generated during the soldering process).

Figure 3:
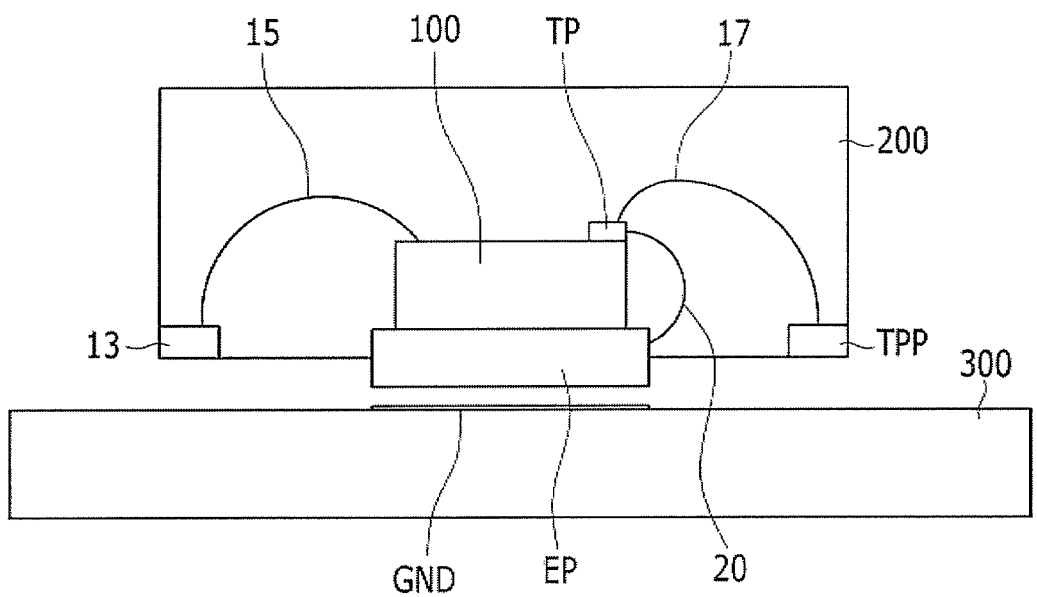
FIG. 3 is a cross-sectional view illustrating a semiconductor device according to an exemplary embodiment of the present invention.

FIG. 3 is a cross-sectional view illustrating a semiconductor device according to an exemplary embodiment of the present invention.

Referring to FIG. 3, a semiconductor package 200 is disposed on a circuit board 300.

An exposed pad (e.g., e-pad EP) is disposed at the rear surface of the semiconductor package 200. In FIG. 3, the e-pad EP is located near the center of the rear surface of the semiconductor package 200, however the location of the e-pad EP is not limited thereto. A semiconductor chip 100 is disposed on the e-pad EP. The semiconductor chip 100 is connected to an external connecting pad 13. For example, wire bonding using wiring 15 may be utilized to electrically connect the semiconductor chip 100 to the external connecting pad 13. In FIG. 3, the external connecting pad 13 is disposed near a corner of the semiconductor package 200, however, the location of the external connecting pad 13 is not limited thereto.

According to the exemplary embodiment shown in FIG. 3, a test pad TP is disposed on the semiconductor chip 100. The test pad TP may be disposed at a variety of locations on the semiconductor chip 100. For example, in FIG. 3, the test pad TP is disposed near an edge of the upper surface of the semiconductor chip 100, and the test pad TP is electrically connected to the e-pad EP. Wire bonding using wiring 20 may be used to electrically connect the test pad TP and the e-pad EP, as shown in FIG. 1, however the manner in which the test pad TP and the e-pad EP are electrically connected is not limited thereto.

The circuit board 300 includes a ground surface GND disposed at a portion corresponding to the e-pad EP of the semiconductor package 200. For example, in FIG. 3, the ground surface GND is disposed near the center of the circuit board 300 such that the ground surface GND aligns with the e-pad EP of the semiconductor package 200. The ground surface GND and the e-pad EP may be disposed at a variety of locations on the circuit board 300 and the semiconductor package 200, respectively. In FIG. 3, a space is shown between the ground surface GND of the circuit board 300 and the e-pad EP. As will be appreciated by one having ordinary skill in the art, this space is included for illustrative purposes to show the formation and alignment of the ground surface GND and the e-pad EP. In the exemplary embodiment, the ground surface GND of the circuit board 300 and the e-pad EP make contact with each other. The e-pad EP includes a first surface and a second, opposing surface. As shown in FIG. 3, the first surface of the e-pad EP is located external to the semiconductor package 200, and makes contact with the ground surface GND of the circuit board 300. The second surface of the e-pad EP is located within the semiconductor package 200, and is electrically connected to the semiconductor chip 100.

In the exemplary embodiment shown in FIG. 3, the test pad TP is electrically connected to the e-pad EP via wiring 20, and is also connected to test pin 17. The test pad TP may also be connected to resistor part RP, as discussed with reference to FIG. 2. Test pin 17 extends from the test pad TP of the semiconductor chip 100, and is electrically connected to a test point TPP formed in the semiconductor package 200. The test point TPP may be an electrical pad similar to the external connecting pad 13, or an end of the test pin 17 may form the test point TPP. In FIG. 3, the test point TPP is disposed near a corner of the semiconductor package 200, opposite the external connecting pad 13. However, the location of the test point TPP is not limited thereto. Measuring equipment may be connected to the test point TPP. The measuring equipment may be used to determine whether the e-pad EP and the ground surface GND are stably electrically connected (e.g., determine whether contact defects were generated during the soldering process).

In an exemplary embodiment, the semiconductor chip 100 is electrically connected to an external device via wiring and an external connecting terminal. The semiconductor chip 100 receives power and signals from the external device, and outputs the operating result to the external device. As discussed above, an operating result having a high logic value indicates that the semiconductor device is operating in a fail mode, and an operating result having a low logic value indicates that the semiconductor device is operating in a normal mode. According to exemplary embodiments of the present invention, a determination of whether the ground surface of the circuit board 300 and the exposed pad EP of the semiconductor package 200 are properly bonded may be made.

While the present invention has been particularly shown and described with reference to the exemplary embodiments thereof, it will be understood by those having ordinary skill in the art that various changes in form and detail may be made therein without departing from the spirit and scope of the present invention as defined by the following claims.

What is claimed is:

1. A semiconductor device, comprising:
    a circuit board comprising a ground portion;
    a semiconductor package disposed on the circuit board, and comprising an external connecting pad and an exposed pad,
    wherein the exposed pad comprises a first surface and a second surface, the exposed pad and the ground portion are electrically connected at the first surface of the exposed pad, and the first surface of the exposed pad aligns with and is disposed on the ground portion;
    a semiconductor chip disposed on the second surface of the exposed pad and electrically connected to the external connecting pad,
    wherein the first surface of the exposed pad is located external to the semiconductor package and the second surface of the exposed pad is located within the semiconductor package;
    a test pad disposed on the semiconductor chip, and electrically connected to the exposed pad; and
    a pull-up resistor disposed in the semiconductor chip,
    wherein a first terminal of the pull-up resistor is connected to a voltage source, and a second terminal of the pull-up resistor is connected to the test pad and electrically connected to the exposed pad through the test pad.

2. The semiconductor device of claim 1, wherein the semiconductor device is configured to output a logic high signal when the semiconductor device is operating in a fail mode, and output a logic low signal when the semiconductor device is operating in a normal mode.

3. The semiconductor device of claim 2, wherein the semiconductor device operates in the fail mode when the exposed pad and the ground portion are not stably electrically connected, and operates in the normal mode when the exposed pad and the ground portion are stably electrically connected.

4. The semiconductor device of claim 1, further comprising:
    a wire electrically connecting the test pad and the exposed pad.

5. The semiconductor device of claim 1, further comprising:
    a test pin electrically connected to the test pad; and
    a test point disposed in the semiconductor package and electrically connected to the test pin.

6. The semiconductor device of claim 5, wherein the test point comprises an end of the test pin.

7. The semiconductor device of claim 5, wherein the test point comprises an electrical pad, and the test pin is electrically connected to the electrical pad.

8. The semiconductor device of claim 5, wherein the external connecting pad is disposed substantially near a first corner of the semiconductor package, and the test point is disposed substantially near a second, opposing corner of the semiconductor package.

9. The semiconductor device of claim 1, wherein the test pad is disposed near an edge of an upper surface of the semiconductor chip.

10. The semiconductor device of claim 1, wherein the exposed pad and the ground portion of the circuit board are bonded to each other using solder.

11. The semiconductor device of claim 1, further comprising:

a first wire directly connecting the test pad and the exposed pad, and electrically connecting the test pad and the exposed pad;

a test pin electrically connected to the test pad;

a test point disposed in the semiconductor package and electrically connected to the test pin, wherein the test pin directly connects the test pad and the test point; and a second wire directly connecting the semiconductor chip and the external connecting pad, and electrically connecting the semiconductor chip and the external connecting pad.

12. A semiconductor package, comprising:

an external connecting pad;

an exposed pad comprising a first surface and a second surface, wherein the first surface is located external to the semiconductor package and aligns with and is electrically connected to a ground portion of a circuit board, wherein the second surface is located within the semiconductor package, and the first surface is disposed on the ground portion;

a semiconductor chip disposed on the second surface of the exposed pad, and electrically connected to the external connecting pad;

a test pad disposed on the semiconductor chip, and electrically connected to the exposed pad; and a pull-up resistor disposed in the semiconductor chip, wherein a first terminal of the pull-up resistor is connected to a voltage source, and a second terminal of the pull-up resistor is connected to the test pad and electrically connected to the exposed pad through the test pad.

13. The semiconductor package of claim 12, wherein the semiconductor package is configured to output a logic high signal when the semiconductor package is operating in a fail mode, and output a logic low signal when the semiconductor package is operating in a normal mode.

14. The semiconductor package of claim 12, further comprising:

a first wire directly connecting the test pad and the exposed pad, and electrically connecting the test pad and the exposed pad;

a test pin electrically connected to the test pad;

a test point disposed in the semiconductor package and electrically connected to the test pin, wherein the test pin directly connects the test pad and the test point; and a second wire directly connecting the semiconductor chip and the external connecting pad, and electrically connecting the semiconductor chip and the external connecting pad.

15. The semiconductor device of claim 1, wherein ends of the first surface of the exposed pad, ends of the second surface of the exposed pad, and ends of the ground portion are substantially aligned with each other.

* * * * *